(12) United States Patent
Liao et al.

(10) Patent No.: US 11,594,557 B2
(45) Date of Patent: Feb. 28, 2023

(54) DISPLAY PANEL, MANUFACTURING METHOD THEREOF, AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Wenjun Liao, Beijing (CN); Taoran Zhang, Beijing (CN); Qiao Feng, Beijing (CN); Linxuan Li, Beijing (CN); Yanyang Shang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 690 days.

(21) Appl. No.: 16/471,696

(22) PCT Filed: Jan. 31, 2019

(86) PCT No.: PCT/CN2019/074197
§ 371 (c)(1),
(2) Date: Jun. 20, 2019

(87) PCT Pub. No.: WO2019/227963
PCT Pub. Date: Dec. 5, 2019

(65) Prior Publication Data
US 2021/0343748 A1     Nov. 4, 2021

(30) Foreign Application Priority Data

May 28, 2018  (CN) .................. 201810520493.X (51) Int. Cl.
*H01L 27/12*     (2006.01)

(52) U.S. Cl.
CPC ........ *H01L 27/124* (2013.01); *H01L 27/1255* (2013.01); *H01L 27/1259* (2013.01)

(58) Field of Classification Search
CPC ............... H01L 27/3276; H01L 27/124; H01L 27/1225; H01L 27/14643; H01L 27/323
See application file for complete search history.

(56) References Cited

U.S. PATENT DOCUMENTS 9,710,089 B2 *   7/2017   Chen ...................... G06F 3/041
2015/0022211 A1   1/2015   Du et al.
(Continued)

FOREIGN PATENT DOCUMENTS

CN     101840455 A     9/2010
CN     103345914 A    10/2013
(Continued)

OTHER PUBLICATIONS

International Search Report and Written Opinion dated Apr. 10, 2019 from State Intellectual Property Office of the P.R. China.

*Primary Examiner* — Tony Tran
(74) *Attorney, Agent, or Firm* — Dilworth & Barrese, LLP.; Michael J. Musella, Esq.

(57) ABSTRACT

A display panel includes a base substrate, a display area and a non-display area provided on the base substrate; a data line is provided in the display area and a detection line is provided in the non-display area on the base substrate; and the detection line is electrically connected to a data line and is formed by overlapping a plurality of wire segments. A method of manufacturing a display panel, and a display device are further disclosed.

10 Claims, 7 Drawing Sheets

(56) References Cited

U.S. PATENT DOCUMENTS

2016/0162080 A1 6/2016 Hayashi et al.
2019/0245028 A1* 8/2019 Lee .................... H01L 27/3276

FOREIGN PATENT DOCUMENTS

| CN | 104503622 A | 4/2015 |
| CN | 108649037 A | 10/2018 |

* cited by examiner

DISPLAY PANEL, MANUFACTURING METHOD THEREOF, AND DISPLAY DEVICE

This application claims priority to Chinese patent application No. 201810520493.X, filed on May 28, 2018, the disclosure of which is incorporated herein by reference in its entirety as part of this application.

TECHNICAL FIELD

The embodiments of the present disclosure relate to a display panel, a manufacturing method thereof, and a display device.

BACKGROUND

In the manufacturing process of a display panel, the non-display area of the display panel is more prone to crack when being bumped. When external moisture and oxygen enter the interior of the display panel through the crack, the display panel cannot be used normally.

In the technology known to the inventors, the crack in the non-display area is detected by providing a detection line in the non-display area of the display panel. For example, the detection line may be electrically connected to a data line(s) in a display area, and upon detecting whether a crack occurs in a non-display area of the display panel, a detection signal can be applied to the data line(s) through the detection line, and whether the display panel displays a vertical bright line(s) can be detected. It should be noted that if cracks occur when the non-display area of the display panel is bumped, the detection line also breaks when it is bumped, and the detection signal cannot be transmitted to the data line(s). In this case, the positions of these data lines display vertical bright lines. Therefore, whether a crack occurs in the non-display area can be determined by detecting whether the display panel can display a vertical bright line(s).

SUMMARY

At least one embodiment of the present disclosure provides a display panel, comprising: a base substrate, a display area and a non-display area arranged on the base substrate; a data line is arranged in the display area and a detection line is arranged in the non-display area; and the detection line is electrically connected to the data line and is formed by overlapping a plurality of wire segments.

In an embodiment of the present disclosure, the plurality of wire segments comprise: first wire segments and other wire segments beside the first wire segments, and a spacer is disposed between the first wire segments and the base substrate.

In an embodiment of the present disclosure, the other wire segments comprise: second wire segments; the first wire segments and the second wire segments are alternately arranged, and the first wire segments are overlapped on the second wire segments.

In an embodiment of the present disclosure, the spacer comprises a first insulating layer located on the second wire segments and covers the non-display area; the first insulating layer is provided with first via holes in communication with the second wire segment; and the first wire segments are arranged on the first insulating layer and overlap with the second wire segments through the first via holes.

In an embodiment of the present disclosure, a first target conductive layer, a first target insulating layer and a second target conductive layer which are sequentially formed are further arranged in a display area on the base substrate; the second wire segments are arranged in the same layer as the first target conductive layer, the first insulating layer is arranged in the same layer as the first target insulating layer, and the first wire segments are arranged in the same layer as the second target conductive layer.

In an embodiment of the present disclosure, a thin film transistor with a top gate structure and a storage capacitor are further arranged in a display area on the base substrate; the thin film transistor comprises: an active layer, a first gate insulating layer, a gate electrode, a second gate insulating layer, a source-drain insulating layer and a source-drain pattern which are sequentially arranged on the base substrate; the storage capacitor comprises: a first electrode, a capacitor insulating layer and a second electrode which are sequentially arranged on the base substrate; the first target conductive layer comprises the gate electrode, the first target insulating layer comprises the second gate insulating layer, and the second target conductive layer comprises the second electrode.

In an embodiment of the present disclosure, the other wire segments comprise: third wire segments and fourth wire segments, the first wire segments and the third wire segments are alternately arranged one by one at intervals, and the fourth wire segments are overlapped on the adjacent first wire segments and third wire segments.

In an embodiment of the present disclosure, the spacer comprises: a second insulating layer located on the third wire segments and covering the non-display area, the first wire segments being disposed on the second insulating layer;

the base substrate is further provided with a third insulating layer located on the first wire segments and covering the non-display area; and the second insulating layer and the third insulating layer are provided with second via holes running through the second insulating layer and the third insulating layer, the second via holes are in communication with the first wire segments and third wire segments that are adjacent, and the fourth wire segments are arranged on the third insulating layer and is overlapped on the third wire segments and the first wire segments through the second via holes.

In an embodiment of the present disclosure, a third target conductive layer, a second target insulating layer, a fourth target conductive layer, a third target insulating layer and a fifth target conductive layer which are sequentially formed are further arranged in a display area on the base substrate.

The third wire segments are arranged in the same layer as the third target conductive layer, the second insulating layer is arranged in the same layer as the second target insulating layer, the first wire segments are arranged in the same layer as the fourth target conductive layer, the third insulating layer is arranged in the same layer as the second target insulating layer, and the fourth wire segments are arranged in the same layer as the fifth target conductive layer.

In an embodiment of the present disclosure, a thin film transistor with a top gate structure and a storage capacitor are further arranged in a display area on the base substrate; the thin film transistor comprises: an active layer, a first gate insulating layer, a gate electrode, a second gate insulating layer, a source-drain insulating layer and a source-drain pattern which are sequentially arranged on a base substrate; the storage capacitor comprises a first electrode, a capacitor insulating layer and a second electrode which are sequentially arranged on the base substrate; the third target conductive layer comprises the gate electrode, the second target insulating layer comprises the second gate insulating layer, the fourth target conductive layer comprises the second electrode, the third target insulating layer comprises the source-drain insulating layer, and the fifth target conductive layer comprises the source-drain pattern.

At least one embodiment of the present disclosure provides a manufacturing method of a display panel, comprising: forming a data line in a display area of the base substrate; and forming a detection line in a non-display area of the base substrate. The detection line is formed by overlapping a plurality of wire segments and is electrically connected to the data line.

In an embodiment of the present disclosure, the manufacturing method further comprises: forming a spacer in a non-display area on the base substrate; the plurality of wire segments comprise first wire segments and other wire segments beside the first wire segments, and the spacer is disposed between the first wire segments and the base substrate.

In an embodiment of the present disclosure, the other wire segments comprise second wire segments, and the forming the detection line in the non-display area of the base substrate comprises: forming the second wire segments in the non-display area of the base substrate; and forming the first wire segments overlapped on the second wire segments in a non-display area of the base substrate. The first wire segments and the second wire segments are alternately arranged one by one.

In an embodiment of the present disclosure, the other wire segments comprise third wire segments and fourth wire segments, and the forming the detection line in the non-display area of the base substrate comprises: forming the third wire segments in the non-display area of the base substrate; forming the first wire segments in the non-display area of the base substrate, wherein the first wire segments and the third wire segments are alternately arranged at an interval; and forming the fourth wire segments overlapped on the first wire segments and the third wire segments that are adjacent in the non-display area of the base substrate.

At least one embodiment of the present disclosure provides a display device comprising the above-mentioned display panel.

BRIEF DESCRIPTION OF THE DRAWINGS

In order to more clearly explain the technical solution of the embodiments of the present disclosure, the drawings of the embodiments will be briefly introduced as follows. Obviously, the drawings described herein below only refer to some embodiments of the present disclosure, rather than limitative of the present disclosure.

DETAILED DESCRIPTION

In order to make the objects, technical solutions and advantages of the embodiments of the present disclosure clearer, the technical solutions of the embodiments of the present disclosure will be described clearly and completely with reference to the drawings of the embodiments of the present disclosure. Obviously, the described embodiments are some but not all embodiments of the present disclosure. Based on the embodiments of the present disclosure described herein, all other embodiments obtained by those of ordinary skill in the art without inventive work are within the scope of protection of the present disclosure.

Figure 1:
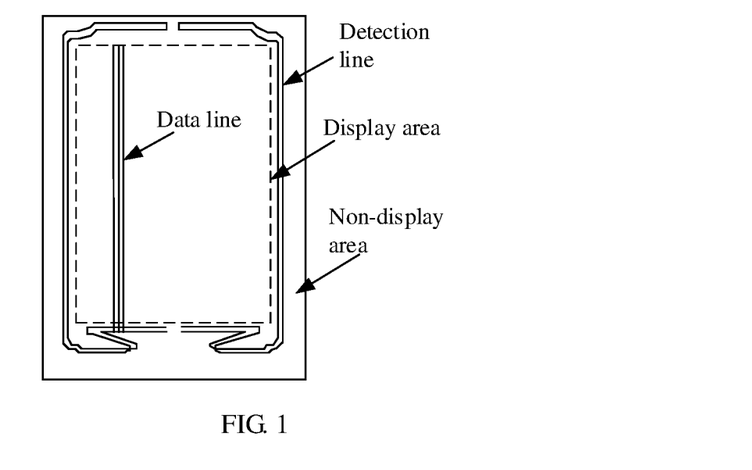
FIG. 1 is a schematic diagram of a detection line known to the inventors.

During the manufacturing process of a display panel, the non-display area of the display panel is prone to crack when being bumped, which will affect the normal use of the display panel. FIG. 1 illustrates the structure of a detection line in the technology known to the inventors, the detection line is arranged in a non-display area 0001 of the display panel, and a detection line 0002 is electrically connected to several data lines 0004 in a display area 0003 of the display panel; if the non-display area 0001 of the display panel is broken, the detection line 0002 is correspondingly broken, in which case, a detection signal cannot be applied to the data lines 0004 through the detection line 0002, and the positions at which the data lines 0004 are located will display vertical bright lines to indicate that the non-display area of the display panel has been broken. The detection line can also be called a panel crack detector (abbreviated as PCD) signal line.

However, the detection line can still transmit signals with a slight breakage, so that when the detection signal is applied to the data line(s) through the detection line, the display panel still does not display the vertical bright line(s). As such, the accuracy of crack detection in the related art is low.

Figure 2:
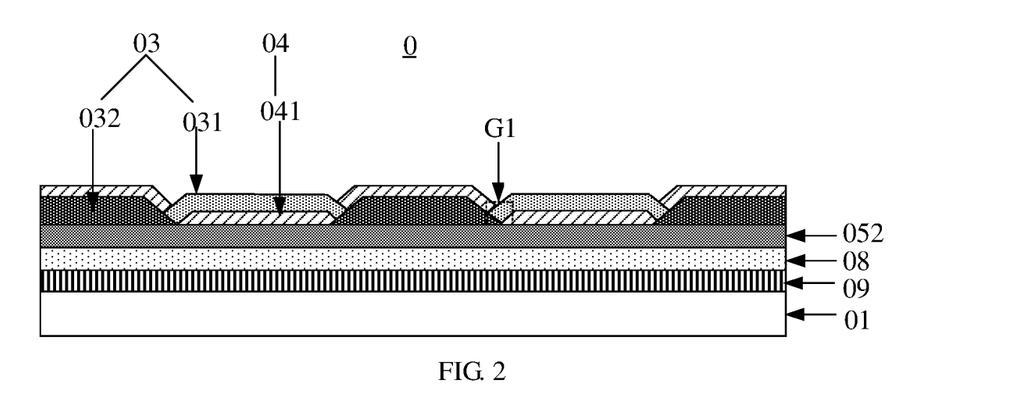
FIG. 2 is a partial structural diagram of a display panel according to one embodiment of the present disclosure.
Figure 3:
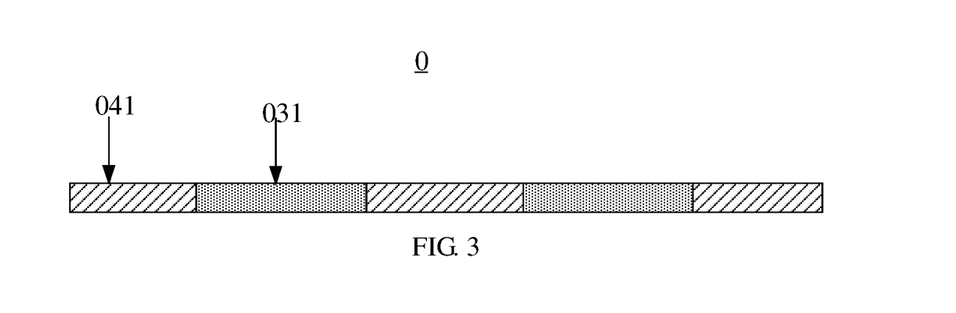
FIG. 3 is a top view of FIG. 2.

At least one embodiment of the present disclosure provides a display panel provided with a detection line through which a crack in a non-display area of the display panel can be detected. FIG. 2 is a partial structural diagram of a display panel according to one embodiment of the present disclosure, and FIG. 3 is a top view of FIG. 2. As shown in FIG. 2 and FIG. 3, the display panel 0 comprises: a base substrate 01, and a display area (not shown in FIG. 2) and a non-display area (area shown in FIG. 2) provided on the base substrate 01, the non-display area being located at the periphery of the display area.

A data line (not shown in FIG. 2) is provided in a display area on the base substrate 01; a detection line 03 is provided in a non-display area on the base substrate 01. The detection line 03 is formed by overlapping a plurality of wire segments and is electrically connected to the data line.

In the display panel according to the embodiments of the present disclosure, the detection line located in the non-display area is formed by overlapping a plurality of wire segments. Therefore, when a slight breakage occurs in the non-display area, the stress at the overlapping position of the plurality of wire segments is relatively large, and a severe breakage may readily occur at the overlapping position, which leads to the disconnection between the wire segments of the detection line and causes it impossible to input a detection signal to the data line through the detection line. In this case, the position at which the data line is located will display a vertical bright line, so that a slight breakage in the non-display area can be effectively detected, which improves the accuracy of crack detection.

In an embodiment of the present disclosure, crack detection can be realized not only by detecting whether the display panel can display a vertical bright line, but also by detecting the resistance of the detection line. For example, if the detection line is broken, the resistance of the detection line will increase. Once the resistance is detected to be higher than a preset resistance, it can be determined that the present detection line is broken and then the non-display area of the display panel is determined to have suffered from being broken. However, in the technology known to the inventors, because the detection line is a single-layer signal line, when the display panel is subjected to an external force, the signal line does not tend to break owing to its good ductility, or the signal line is only slightly broken. In this case, the resistance change in the detection line is small, and a crack cannot be detected. For example, as shown in Table 1 below, in the following 12 cases, the results regarding whether a crack is detected and the resistance of the detection line are consistent with the results regarding whether a crack occurs in the display panel in the first, second, third, tenth, eleventh and twelfth cases; whereas in the fourth to ninth cases, although a crack occurs in the display panel, no crack is detected through the detection line and the resistance change of the detection line is small, and thus no crack can be detected in these cases.

TABLE 1

| Case | Whether a crack occurs in the display panel | Whether a crack is detected | Resistance of the detection line |
|---|---|---|---|
| 1 | NO | NO | 24.1 KΩ |
| 2 | NO | NO | 25.1 KΩ |
| 3 | NO | NO | 22.1 KΩ |
| 4 | YES | NO | 22.2 KΩ |
| 5 | YES | NO | 42.5 KΩ |
| 6 | YES | NO | 30.7 KΩ |
| 7 | YES | NO | 30.1 KΩ |
| 8 | YES | NO | 22.8 KΩ |
| 9 | YES | NO | 27.8 KΩ |
| 10 | YES | YES | 1871 KΩ |
| 11 | YES | YES | 1035 KΩ |
| 12 | YES | YES | 239.3 KΩ |

In the embodiments of the present disclosure, a detection line is formed by overlapping layers of wire segments. When the display panel is slightly broken due to an external force, a severe breakage will occur at the overlapping position(s) of the layers of wire segments. In this case, the resistance change in the detection line is great and cracks can be detected.

In an embodiment of the present disclosure, the plurality of wire segments that are overlapped to form the detection line 03 may comprise: at least one first wire segment 031 and other wire segments beside the at least one first wire segment 031; a spacer 04 is disposed between each first wire segment 031 and the base substrate 01.

As the spacer 04 is arranged below the first wire segment 031, the height of the first wire segment 031 can be increased and the segment difference between the first wire segment 031 and the wire segment overlapping with the first wire segment 031 can be increased, so that when the display panel is subjected to an external force, the stress at the position of the larger segment difference is relatively large, and breakage occurs more easily at the position. The so-called segment difference refers to the height difference between two film layers, usually the height difference between the bottom of one film layer and the bottom of another film layer. As such, the slight breakage in the non-display area can be detected more effectively, thus further improving the accuracy of crack detection.

It should be noted that the plurality of wire segments can be overlapped to connect in a plurality of methods, and the following two overlapping methods will be described in the embodiments of the present disclosure.

On one hand, a first overlapping method of the plurality of wire segments can be as shown in FIG. 2 and FIG. 3. In the first overlapping method, the other wire segments can comprise a plurality of second wire segments 032, the first wire segments 031 and the second wire segments 032 are alternately arranged one by one, and the first wire segments 031 are overlapped on the second wire segments 032.

The spacer 04 may comprise a first insulating layer 041 located on a plurality of second wire segments 032 and covering a non-display area; the first insulating layer 041 is provided with a plurality of first via holes G1 therethrough and in communication with a plurality of second wire segments 032; a plurality of first wire segments 031 are disposed on the first insulating layer 041 and overlap with a plurality of second wire segments 032 through the plurality of first via holes G1 to realize electrical connection.

In an embodiment of the present disclosure, a plurality of film layers may be disposed in a display area on a base substrate, the plurality of film layers may comprise: a first target conductive layer, a first target insulating layer, and a second target conductive layer which are sequentially formed; that is, in the first target conductive layer, the first target insulating layer, and the second target conductive layer, the first target conductive layer is formed first, the first target insulating layer is formed second, and the second target conductive layer is formed third. In the embodiments of the present disclosure, the second wire segments may be arranged in the same layer as the first target conductive layer, the first insulating layer may be arranged in the same layer as the first target insulating layer, and the first wire segments may be arranged in the same layer as the second target conductive layer. That is, the first wire segments, the second wire segments, and the first insulating layer that need to be formed in the non-display area can all be arranged in the same layer as the film layers in the display area, which can improve the manufacturing efficiency of the display panel.

The so-called "arranged in the same layer" means that the components are made of the same material and formed by the same patterning process. A patterning process comprises: photoresist coating, exposure, development, etching and photoresist stripping. Therefore, treating the material by a patterning process comprises: coating a layer of photoresist on a wire layer; exposing the photoresist with a mask plate, so that the photoresist forms a fully exposed area and a non-exposed area; performing treatment with a development process to remove the photoresist in the fully exposed area and retain the photoresist in the non-exposed area; etching the corresponding area of the material layer in the fully exposed area; and stripping the photoresist in the non-exposed area after etching to obtain components arranged in the same layer.

Figure 4:
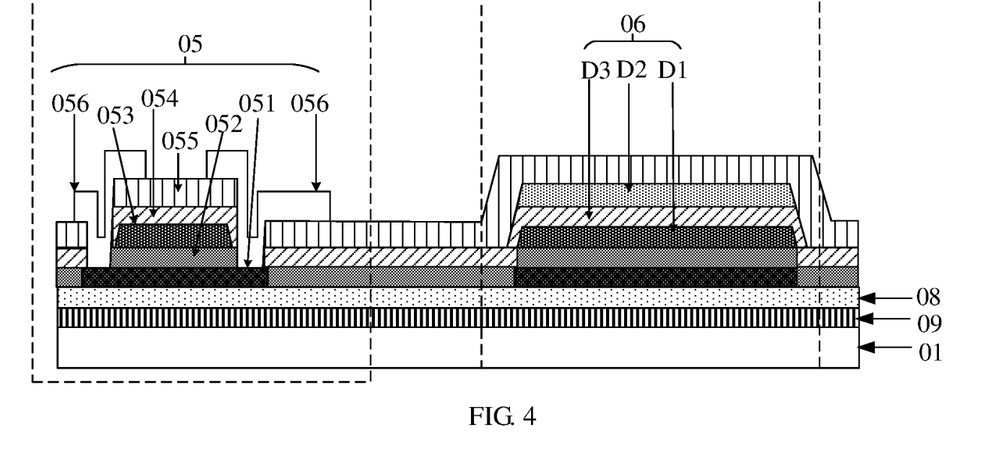
FIG. 4 is a partial structural diagram of a display panel according to another embodiment of the present disclosure.

FIG. 4 is a partial structural diagram of a display panel according to another embodiment of the present disclosure. As shown in FIG. 4, a thin film transistor (abbreviated as TFT) 05 with a top gate structure and a storage capacitor 06 may be further provided in the display area on the base substrate 01; the thin film transistor 05 may comprise: an active layer 051, a first gate insulating layer 052, a gate electrode 053, a second gate insulating layer 054, a source-drain insulating layer 055, and a source-drain pattern 056, which are sequentially disposed on the base substrate 01; the storage capacitor 06 may comprise: a first electrode D1, a capacitor insulating layer D3, and a second electrode D2, which are sequentially disposed on the base substrate 01.

The first target conductive layer may comprise the gate electrode, the first target insulating layer may comprise the second gate insulating layer, and the second target conductive layer may comprise the second electrode. Referring to FIG. 2, FIG. 3 and FIG. 4, the first wire segments 031 may be arranged in the same layer as the second electrode D2 of the storage capacitor 06, the second wire segments 032 may be arranged in the same layer as the gate electrode 053 of the thin film transistor 05, and the first insulating layer 041 may be arranged in the same layer as the second gate insulating layer 054.

In an embodiment of the present disclosure, the film layers in the non-display area may also be formed in the same layers as other film layers in the display area, for example, the second wire segments may also be arranged in the same layer as the source-drain pattern, and in this case, the second target conductive layer may comprise a source-drain pattern; the thin film transistor in the display area may not be a thin film transistor with a top gate structure, for example, the thin film transistor in the display area may also be a thin film transistor with a bottom gate structure, etc., which is not limited in the embodiments of the present disclosure.

In an embodiment of the present disclosure, the first wire segments may have a length of 10 microns and the second wire segments may have a length of 10 microns.

Figure 5:
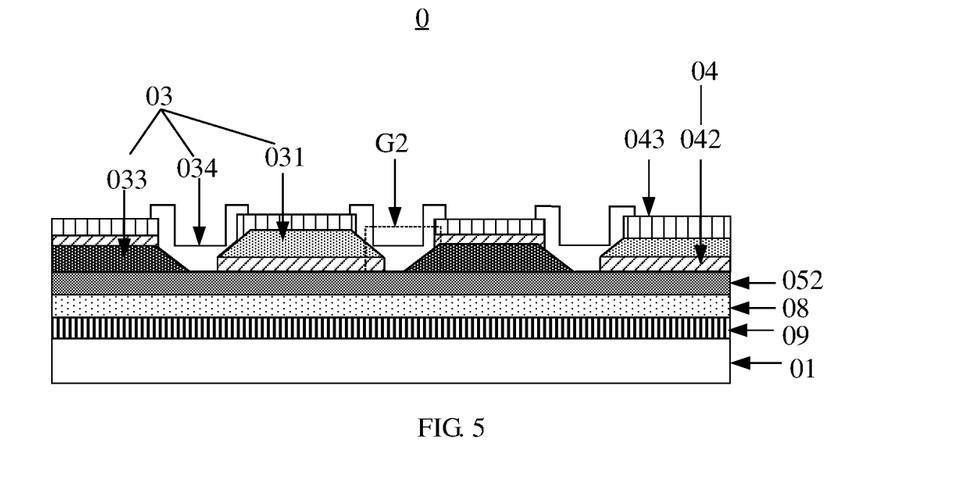
FIG. 5 is a partial structural diagram of a display panel according to yet another embodiment of the present disclosure.
Figure 6:
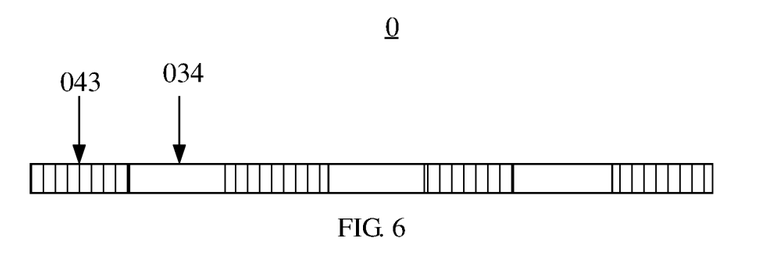
FIG. 6 is a top view of FIG. 5.

FIG. 5 is a partial structural diagram of a display panel according to another embodiment of the present disclosure, and FIG. 6 is a top view of FIG. 5. FIG. 5 illustrates a second overlapping method of a plurality of wire segments. As shown in FIG. 5, the other wire segments may comprise: a plurality of third wire segments 033 and a plurality of fourth wire segments 034. The first wire segments 031 and the third wire segments 033 are alternately arranged one by one at an interval(s), and a fourth wire segment 034 is overlapped on a first wire segment 031 and a third wire segment 033 that are adjacent.

In an embodiment of the present disclosure, the spacer 04 comprises: a second insulating layer 042 located on a plurality of third wire segments 033 and covering the non-display area, the plurality of first wire segments 031 are disposed on the second insulating layer 042; the base substrate 01 is further provided with a third insulating layer 043 located on the plurality of first wire segments 031 and covering the non-display area; the second insulating layer 042 and the third insulating layer 043 are provided with a plurality of second via holes G2 running through the second insulating layer 042 and the third insulating layer 043, each of the second via holes G2 being in communication with the first wire segment 031 and the third wire segment 033 that are adjacent; the plurality of fourth wire segments 034 are provided on the third insulating layer 043, and are overlapped on the plurality of third wire segments 033 and the plurality of first wire segments 031 through the plurality of second via holes G2, respectively, to realize electrical connection.

A plurality of film layers may be disposed in a display area on a base substrate, the plurality of film layers may comprise: a third target conductive layer, a second target insulating layer, a fourth target conductive layer, a third target insulating layer, and a fifth target conductive layer, which are sequentially formed. In the embodiments of the disclosure, the third wire segments are arranged in the same layer as the third target conductive layer, the second insulating layer is arranged in the same layer as the second target insulating layer, the first wire segments are arranged in the same layer as the fourth target conductive layer, the third insulating layer is arranged in the same layer as the second target insulating layer, and the fourth wire segments are arranged in the same layer as the fifth target conductive layer. That is, the first wire segments, the second wire segments, and the first insulating layer that need to be formed in the non-display area can all be arranged in the same layers as the film layers of the display area, so that the film layers in the same layers can be formed simultaneously, thereby improving the manufacturing efficiency of the display panel.

For example, as shown in FIG. 4, FIG. 5, and FIG. 6, a thin film transistor 05 and a storage capacitor 06 may be further provided in the display area on the base substrate 01. The third target conductive layer may comprise a gate electrode 053, the second target insulating layer may comprise a second gate insulating layer 054, the fourth target conductive layer may comprise a second electrode D2, the third target insulating layer may comprise a source-drain insulating layer 055, and the fifth target conductive layer may comprise a source-drain pattern 056. That is, the first wire segments 031 may be arranged in the same layer as the second electrode D2, the third wire segments 033 may be arranged in the same layer as the gate electrode 053 in the thin film transistor 05, the fourth wire segments 034 may be arranged in the same layer as the source-drain pattern 056, the second insulating layer 042 may be arranged in the same layer as the second gate insulating layer 054, and the third insulating layer 043 may be arranged in the same layer as the source-drain insulating layer 055 in the thin film transistor 05.

In an embodiment of the present disclosure, the thin film transistor in the display area may not be a thin film transistor with a top gate structure, for example, the thin film transistor in the display area may also be a thin film transistor with a bottom gate structure, etc., which is not limited in the embodiments of the present disclosure.

In an embodiment of the present disclosure, the first wire segments may have a length of 10 microns, the third wire segments may have a length of 10 microns, and the fourth wire segments may have a length of 3 microns.

In addition, also referring to FIG. 2 to FIG. 5, the display panel may be further provided with: a buffer layer 08 and a polyimide layer 09, and the first gate insulating layer 052 in the thin film transistor may extend to the non-display area. As shown in FIG. 5, in the non-display area, the first gate insulating layer 052, the buffer layer 08, and the polyimide layer 09 are all located between the base substrate 01 and the plurality of third wire segments 033, and the polyimide layer is disposed closer to the base substrate 01. As shown in FIG. 2, in the non-display area, the first gate insulating layer 052, the buffer layer 08, and the polyimide layer 09 are all located between the base substrate 01 and the plurality of second wire segments 032, and the polyimide layer is disposed closer to the base substrate 01.

The display panel according to the embodiments of the present disclosure may be an organic light-emitting diode (abbreviated as OLED) display panel or liquid crystal display panel. Moreover, the OLED display panel includes OLED materials. Because OLED materials are extremely sensitive to water and oxygen, erosion by even a small amount of water and oxygen will lead to display failure of the OLED display panel. When the display panel is subjected to an external force such as bumping and bending, the edge of the display panel may easily suffers from microcracks. When the cracks extend to the display area, i.e., become channels for water and oxygen to enter and erode OLED materials in the display area, they eventually lead to failure of the display product. According to the embodiments of the disclosure, whether the display panel is cracked or not can be effectively detected through the signal line, thereby further preventing failure of the display panel.

To sum up, in the display panel according to the embodiments of the present disclosure, the detection line located in the non-display area is formed by overlapping a plurality of wire segments. Therefore, when a slight breakage occurs in the non-display area, the stress at the overlapping position of the plurality of wire segments is large, and a severe breakage may easily occur at the overlapping position. In this case, it is impossible to input a detection signal to the data line through the detection line because the breakage at the breakage part is severe, and the position at which the data line is located will display a vertical bright line, so that the slight breakage in the non-display area can be effectively detected, which improves the accuracy of crack detection.

Figure 7:
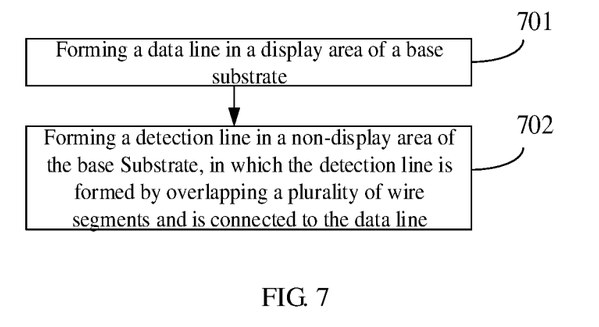
FIG. 7 is a flowchart of a manufacturing method of a display panel according to one embodiment of the present disclosure.

FIG. 7 is a flowchart of a manufacturing method of a display panel according to one embodiment of the present disclosure, and the display panel may be the display panel as shown in FIG. 2 or FIG. 5. As shown in FIG. 7, the manufacturing method of the display panel may comprise the following steps:

Step 701: forming a data line in a display area of a base substrate; and

Step 702, forming a detection line in a non-display area of the base substrate; the detection line is formed by overlapping a plurality of wire segments and is electrically connected to the data line.

To sum up, in the display panel manufactured by the method according to the embodiments of the present disclosure, the detection line located in the non-display area is formed by overlapping a plurality of wire segments. Therefore, when a slight breakage occurs in the non-display area, the stress at the overlapping position of the plurality of wire segments is large, and a severe breakage may easily occur at the overlapping position. In this case, it is impossible to input a detection signal to the data line through the detection line because the breakage at the breakage part is severe, and the position at which the data line is located will display a vertical bright line, so that the slight breakage in the non-display area can be effectively detected, which improves the accuracy of crack detection.

Figure 8:
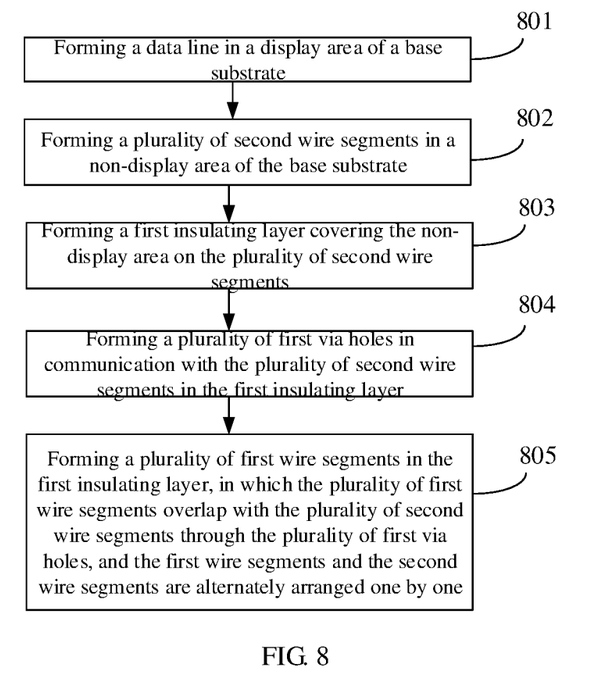
FIG. 8 is a flowchart of a manufacturing method of a display panel according to another embodiment of the present disclosure.

FIG. 8 is a flowchart of a manufacturing method of a display panel according to another embodiment of the present disclosure, wherein the display panel may be the display panel as shown in FIG. 2. As shown in FIG. 8, the manufacturing method of the display panel may comprise the following steps:

Step 801: forming a data line in a display area of a base substrate.

For example, a gate line, a thin film transistor with a top gate structure, and a storage capacitor may be further formed in a display area of the base substrate. It should be noted that reference may be made to related technologies for the process of manufacturing each structure in the display area of the display panel, and no further detail is provided in the embodiments of the present disclosure herein. For example, the thin film transistor in the display area may not be a thin film transistor with a top gate structure, for example, the thin film transistor in the display area may also be a thin film transistor with a bottom gate structure, etc., which is not limited in the embodiments of the present disclosure.

Step 802: forming a plurality of second wire segments in a non-display area of the base substrate.

Figure 9:
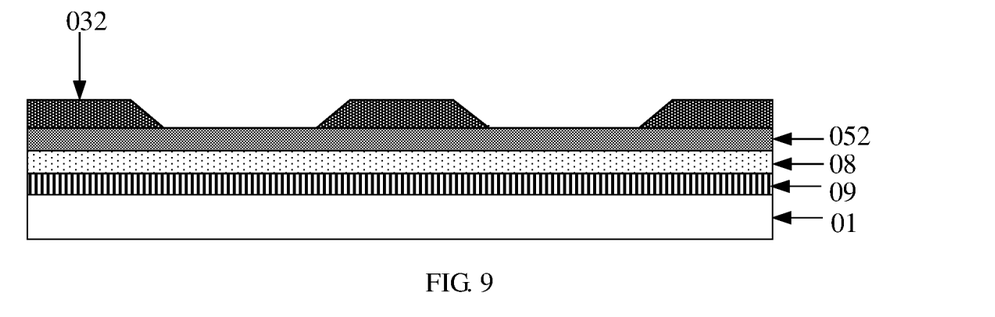
FIG. 9 to FIG. 11 are structural diagrams formed according to each process step of the manufacturing method of the display panel shown in FIG. 8.

As shown in FIG. 9, a polyimide layer 09, a buffer layer 08, and a first gate insulating layer 052 may be sequentially formed in the non-display area of the base substrate 01 prior to step 802.

In step 802, a plurality of second wire segments 032 may be formed on the first gate insulating layer 052. Illustratively, the process of forming the plurality of second wire segments 032 may comprise: depositing a wire layer in the non-display area of the base substrate 01 by sputtering, or, for example, forming the wire layer by coating or sputtering; then, subjecting the wire layer to patterned treatment by a patterning process, to obtain the plurality of second wire segments 032.

A patterning process comprises: photoresist coating, exposure, development, etching and photoresist stripping. Therefore, treating the wire layer by the one-time patterning process comprises: coating a layer of photoresist on the wire layer; exposing the photoresist with a mask plate, so that the photoresist forms a fully exposed area and a non-exposed area; performing treatment with a development process to remove the photoresist in the fully exposed area and retain the photoresist in the non-exposed area; etching the corresponding area on the wire layer in the fully exposed area; and stripping the photoresist in the non-exposed area after etching, to obtain the plurality of second wire segments.

Step 803: forming a first insulating layer covering the non-display area on the plurality of second wire segments.

Figure 10:
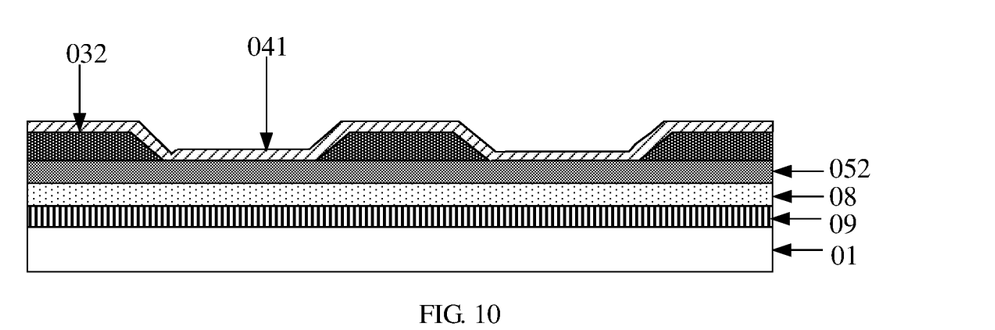

As shown in FIG. 10, after forming the plurality of second wire segments 032, a first insulating layer 041 covering a non-display area may be formed on the plurality of second wire segments 032. Moreover, the step of forming the first insulating layer comprises: depositing an insulating layer by a plasma enhanced chemical vapor deposition (abbreviated as PECVD) method, to obtain the first insulating layer 041.

Step 804: forming a plurality of first via holes in communication with a plurality of second wire segments in the first insulating layer.

Figure 11:
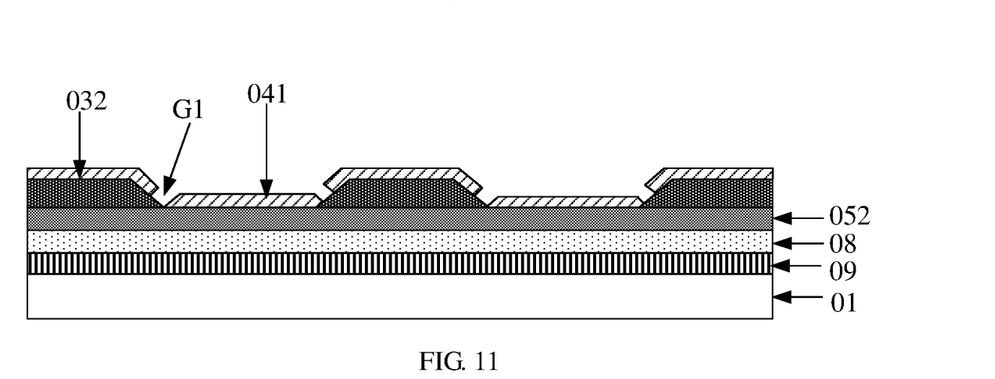

As shown in FIG. 11, in step 804, the first insulating layer 041 may be treated by a patterning process to form a plurality of first via holes G1 in the first insulating layer 041; each of the first via holes G1 is electrically connected to a second wire segment 032, and the plurality of first via holes G1 are in communication with the plurality of second wire segments 032 formed in step 802.

It should be noted that in the embodiments of the present disclosure, for the process of treating a certain film layer by a patterning process, reference may be made to the process of treating a wire layer by a patterning process in step 802, and no further detail will be described herein.

Step 805: forming a plurality of first wire segments on the first insulating layer. The plurality of first wire segments overlap with the plurality of second wire segments through the plurality of first via holes, respectively, and the first wire segments and the second wire segments are alternately arranged one by one.

As shown in FIG. 2, after forming first via holes, a wire layer can be deposited on the first insulating layer 041 by sputtering, and the wire layer is treated by a patterning process, to obtain a plurality of first wire segments 031; the plurality of first wire segments 031 overlap with the plurality of second wire segments 032 formed in step 802 through the plurality of first via holes formed in step 804, respectively, and the first wire segments 031 and the second wire segments 032 are alternately arranged one by one.

It should be noted that the detection line is formed by overlapping a plurality of first wire segments and a plurality of second wire segments, and is electrically connected to a data line. A spacer (i.e., a first insulating layer) is provided between each first wire segment and the base substrate.

To sum up, in the display panel manufactured by the method according to the embodiments of the present disclosure, the detection line located in the non-display area is formed by overlapping a plurality of wire segments. Therefore, when a slight breakage occurs in the non-display area, the stress at the overlapping position of the plurality of wire segments is relatively large, and a severe breakage may easily occur at the overlapping position. In this case, it is impossible to input a detection signal to the data line through the detection line because the breakage at the breakage part is severe, and the position at which the data line is located will display a vertical bright line, so that the slight breakage in the non-display area can be effectively detected, which improves the accuracy of crack detection.

Figure 12:
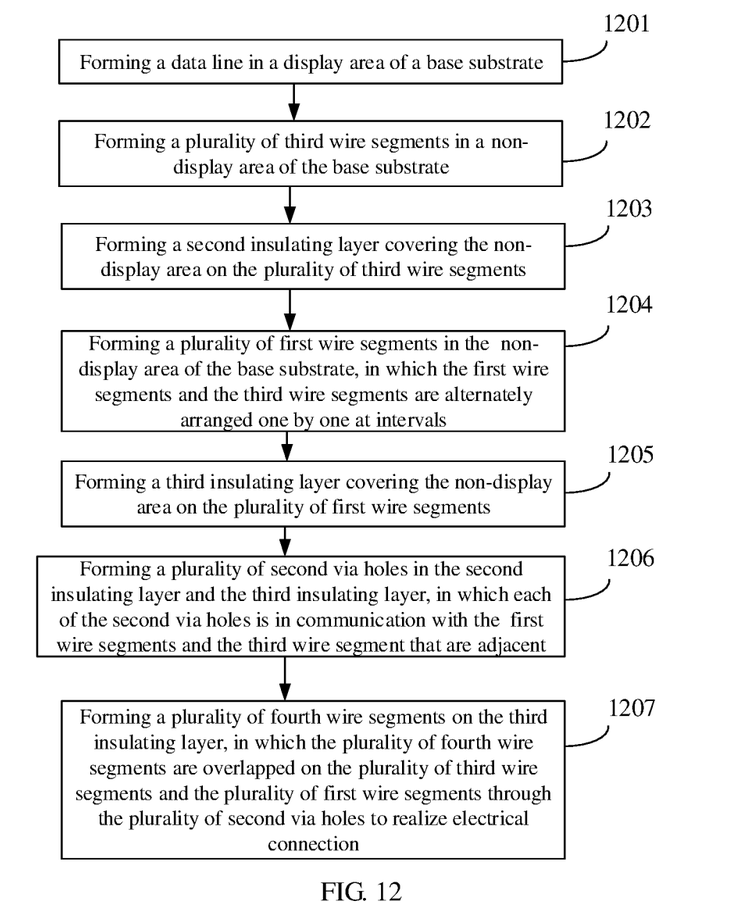
FIG. 12 is a flowchart of another manufacturing method of a display panel according to an embodiment of the present invention.

FIG. 12 is a flowchart of a manufacturing method of a display panel according to yet another embodiment of the present disclosure, and the display panel may be the display panel as shown in FIG. 5. As shown in FIG. 12, the manufacturing method of the display panel may comprise the following steps:

Step 1201: forming a data line in a display area of a base substrate.

For example, a gate line, a thin film transistor with a top gate structure, and a storage capacitor may be further formed in a display area of the base substrate. It should be noted that reference may be made to relevant technologies for the process of manufacturing each structure in the display area of the display panel, and no further detail will be described herein. For example, the thin film transistor in the display area may not be a thin film transistor with a top gate structure, for example, the thin film transistor in the display area may also be a thin film transistor with a bottom gate structure, etc., which is not limited in the embodiments of the present disclosure.

Step 1202: forming a plurality of third wire segments in the non-display area of the base substrate.

Figure 13:
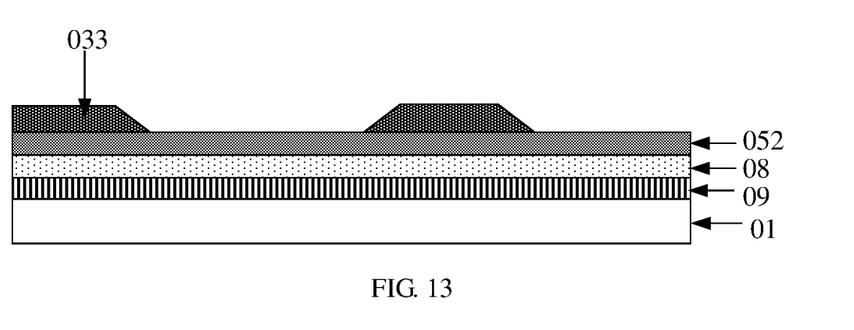
FIG. 13 to FIG. 17 are structural diagrams formed according to each process step of at least the method of the display panel shown in FIG. 12.

As shown in FIG. 13, prior to step 1202, a polyimide layer 09, a buffer layer 08, and a first gate insulating layer 052 may be sequentially formed in the non-display area of the base substrate 01.

In step 1202, a plurality of third wire segments 033 may be formed on the first gate insulating layer 052. For the process of forming the third wire segments 033, reference may be made to step 802 in the embodiment as shown in FIG. 8, and no further detail will be provided herein.

Step 1203: forming a second insulating layer covering the non-display area on the plurality of third wire segments.

Figure 14:
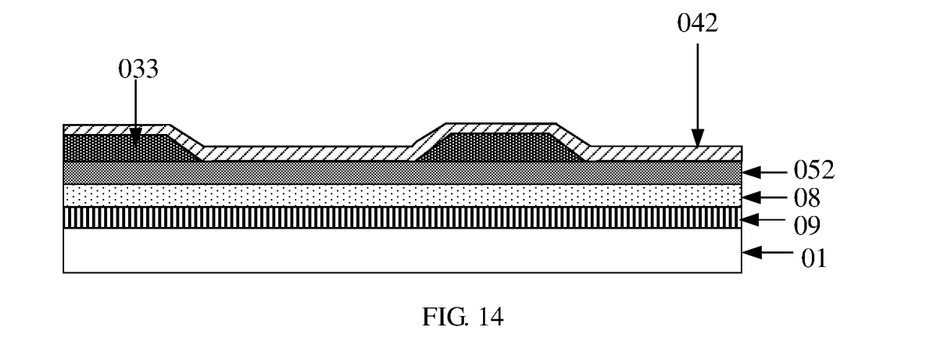

As shown in FIG. 14, in step 1203, a second insulating layer 042 covering the non-display area may be formed on a plurality of third wire segments 033. For the process of forming the second insulating layer 042, reference may be made to step 803 in the embodiment as shown in FIG. 8, and no further detail will be provided herein.

Step 1204, forming a plurality of first wire segments in the non-display area of the base substrate. The first wire segments and the third wire segments are alternately arranged one by one at intervals.

Figure 15:
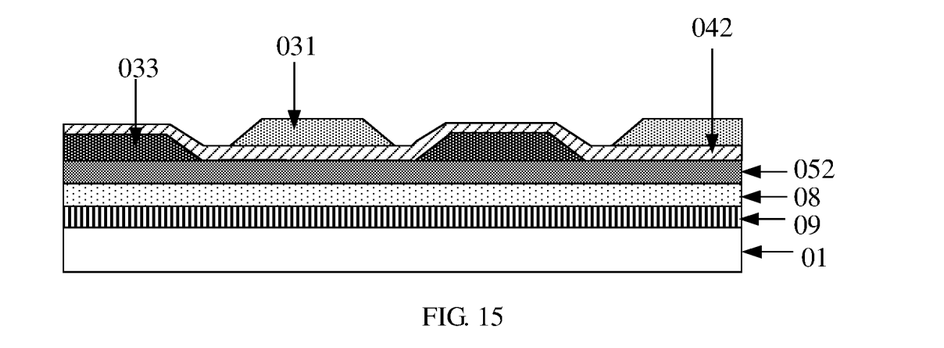

As shown in FIG. 15, in step 1204, a plurality of first wire segments 031 may be formed in the non-display area of the base substrate 01. For the process of forming the first wire segments 031, reference may be made to step 802 in the embodiment as shown in FIG. 8, and no further detail will be provided herein. Besides, the first wire segments 031 and the third wire segments 033 are alternately arranged one by one at intervals.

Step 1205: forming a third insulating layer covering the non-display area on the plurality of first wire segments.

Figure 16:
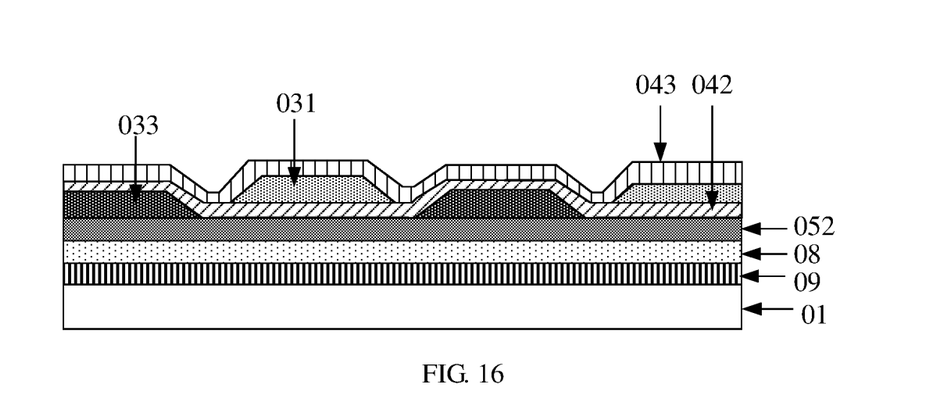

As shown in FIG. 16, in step 1205, a third insulating layer 043 covering a non-display area may be formed on a plurality of first wire segments 031. For the process of forming the third insulating layer 043, reference may be made to step 803 in the embodiment as shown in FIG. 8, and no further detail will be provided herein.

Step 1206: forming a plurality of second via holes in the second insulating layer and the third insulating layer, each of the second via holes being in communication with the first wire segment and the third wire segment that are adjacent.

Figure 17:
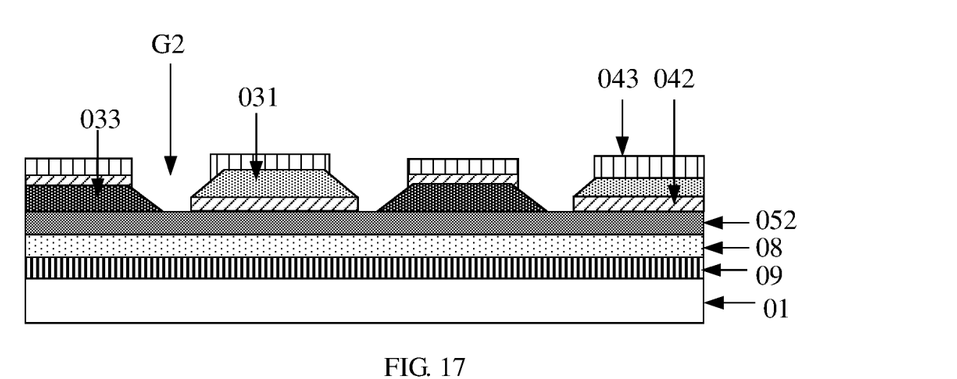

As shown in FIG. 17, in step 1206, a plurality of second via holes may be formed in the second insulating layer 042 and the third insulating layer 043. For the process of forming the second via holes, reference may be made to step 804 in the embodiment as shown in FIG. 8, and no further detail will be provided herein. Each of the second via holes are in communication with the first wire segment 031 and the third wire segment 033 that are adjacent.

Step 1207: forming a plurality of fourth wire segments on the third insulating layer. The plurality of fourth wire segments are overlapped on the plurality of third wire segments and the plurality of first wire segments through the plurality of second via holes respectively to realize electrical connection.

As shown in FIG. 5, in step 1207, a plurality of fourth wire segments 034 may be formed on the third insulating layer 043. For the process of forming the fourth wire segments 034, reference may be made to step 802 in the embodiment as shown in FIG. 8, and no further detail will be provided herein.

It should be noted that the detection line is formed by overlapping a plurality of first wire segments, a plurality of third wire segments and a plurality of fourth wire segments, and is electrically connected to the data line. A spacer (i.e., a second insulating layer) is arranged between each first wire segment and the base substrate.

To sum up, in the display panel manufactured by the method according to the embodiment of the present disclosure, the detection line located in the non-display area is formed by overlapping a plurality of wire segments. Therefore, when a slight breakage occurs in the non-display area, the stress at the overlapping position of the plurality of wire segments is relatively large, and a severe breakage may easily occur at the overlapping position. In this case, it is impossible to input a detection signal to the data line through the detection line because the breakage at the breakage part is severe, and the position at which the data line is located will a display vertical bright line, so that the slight breakage in the non-display area can be effectively detected, which improves the accuracy of crack detection.

At least one embodiment of the present disclosure provides a display device, which comprises a display panel as shown in FIG. 2 or FIG. 5. The display device can be any product or component with a display function such as a liquid crystal display device, electronic paper, an organic light-emitting diode display device, a cellphone, a tablet PC, a television, a display, a laptop, a digital photo frame, a navigator or the like.

It should be noted that the method embodiments of the present disclosure can be cross-referenced with the corresponding display panel embodiments, which is not limited in the embodiments of the present disclosure. The sequence of the steps in the method embodiments according to the embodiments of the present disclosure can be appropriately adjusted, and the steps can be correspondingly added or reduced depending upon conditions. Any method that can be easily changed by a person familiar with the technical field within the technical scope disclosed in the present disclosure should be covered within the scope of protection of the present disclosure, and thus no further detail is provided herein.

The above description is merely an exemplary embodiment of the present disclosure and is not intended to limit the scope of protection of the present disclosure, which is determined by the appended claims.

What is claimed is:

1. A display panel comprising:
a base substrate, and
a display area and a non-display area provided on the base substrate,
wherein a data line is provided in the display area and a detection line is provided in the non-display area; and the detection line is electrically connected to the data line and comprises a plurality of wire segments, and the plurality of wire segments overlap to form the detection line;
the entire detection line extends on a surface of the base substrate along an extension direction parallel to the surface of the base substrate, all of the plurality of wire segments extend along the extension direction and are sequentially arranged along the extension direction, two adjacent wire segments of the plurality of wire segments are respectively a previous segment and a next segment, the previous segment has a first end close to the next segment in the extension direction, the next segment has a first end close to the previous segment in the extension direction, the first end of the previous segment overlaps and directly contacts the first end of the next segment;
wherein the plurality of wire segments comprise first wire segments and other wire segments beside the first wire segments, and a spacer is disposed between the first wire segments and the base substrate;
wherein the other wire segments comprise second wire segments, and
the first wire segments are alternately arranged with the second wire segments, and are overlapped on the second wire segments, respectively;
one of the first wire segments and one of the second wire segments that are adjacent to each other constitute the two adjacent wire segments of the plurality of wire segments; and
wherein a first target conductive layer, a first target insulating layer and a second target conductive layer, which are sequentially formed, are further disposed in the display area on the base substrate;
the second wire segments are arranged in a same layer as the first target conductive layer;
the first insulating layer is arranged in a same layer as the first target insulating layer; and
the first wire segments are arranged in a same layer as the second target conductive layer.

2. The display panel according to claim 1, wherein
the spacer comprises a first insulating layer, which is located on the second wire segments and covers the non-display area;
the first insulating layer is provided with first via holes in communication with the second wire segments; and
the first wire segments are arranged on the first insulating layer and overlap and in contact with the second wire segments through the first via holes, respectively.

3. The display panel according to claim 2, wherein
a first target conductive layer, a first target insulating layer and a second target conductive layer, which are sequentially formed, are further disposed in the display area on the base substrate;
the second wire segments are arranged in a same layer as the first target conductive layer;
the first insulating layer is arranged in a same layer as the first target insulating layer; and
the first wire segments are arranged in a same layer as the second target conductive layer.

4. The display panel according to claim 3, wherein
a thin film transistor with a top gate structure and a storage capacitor are further disposed in the display area on the base substrate;
the thin film transistor comprises an active layer, a first gate insulating layer, a gate electrode, a second gate insulating layer, a source-drain insulating layer and a source-drain pattern, which are sequentially arranged on the base substrate;
the storage capacitor comprises a first electrode, a capacitor insulating layer, and a second electrode, which are sequentially arranged on the base substrate;
the first target conductive layer comprises the gate electrode;
the first target insulating layer comprises the second gate insulating layer; and
the second target conductive layer comprises the second electrode.

5. The display panel according to claim 1, wherein
a thin film transistor with a top gate structure and a storage capacitor are further disposed in the display area on the base substrate;
the thin film transistor comprises an active layer, a first gate insulating layer, a gate electrode, a second gate insulating layer, a source-drain insulating layer and a source-drain pattern, which are sequentially arranged on the base substrate;
the storage capacitor comprises a first electrode, a capacitor insulating layer, and a second electrode, which are sequentially arranged on the base substrate;
the first target conductive layer comprises the gate electrode;
the first target insulating layer comprises the second gate insulating layer; and
the second target conductive layer comprises the second electrode.

6. The display panel according to claim 1, wherein
the other wire segments comprise third wire segments and fourth wire segments, wherein the first wire segments and the third wire segments are alternately arranged one by one at an interval, and the fourth wire segments are overlapped on the first wire segments and the third wire segments that are adjacent.

7. The display panel according to claim 6, wherein the spacer comprises: a second insulating layer located on the third wire segments and covering the non-display area, the first wire segments are arranged on the second insulating layer;
the base substrate is further provided with a third insulating layer located on the first wire segments and covering the non-display area;
the second insulating layer and the third insulating layer are provided with second via holes running through the second insulating layer and the third insulating layer;
the second via holes are in communication with the first wire segments and the third wire segments that are adjacent; and
the fourth wire segments are arranged on the third insulating layer, and are overlapped on the third wire segments and the first wire segments through the second via holes, respectively.

8. The display panel according to claim 7, wherein a third target conductive layer, a second target insulating layer, a fourth target conductive layer, a third target insulating layer and a fifth target conductive layer which are sequentially formed are further disposed in the display area on the base substrate,
the third wire segments are arranged in a same layer as the third target conductive layer, the second insulating layer is arranged in a same layer as the second target insulating layer, the first wire segments are arranged in a same layer as the fourth target conductive layer, the third insulating layer is arranged in a same layer as the second target insulating layer, and the fourth wire segments are arranged in a same layer as the fifth target conductive layer.

9. The display panel according to claim 8, wherein a thin film transistor with a top gate structure and a storage capacitor are further disposed in a display area on the base substrate,
the thin film transistor comprises an active layer, a first gate insulating layer, a gate electrode, a second gate insulating layer, a source-drain insulating layer and a source-drain pattern, which are sequentially arranged on the base substrate;
the storage capacitor comprises a first electrode, a capacitor insulating layer and a second electrode, which are sequentially arranged on the base substrate;
the third target conductive layer comprises the gate electrode, the second target insulating layer comprises the second gate insulating layer, the fourth target conductive layer comprises the second electrode, the third target insulating layer comprises the source-drain insulating layer, and the fifth target conductive layer comprises the source-drain pattern.

10. A display device, comprising a display panel, wherein the display panel comprises:
a base substrate, and
a display area and a non-display area provided on the base substrate,
wherein a data line is provided in the display area and a detection line is provided in the non-display area; and the detection line is electrically connected to the data line and comprises a plurality of wire segments, and the plurality of wire segments overlap to form the detection line;
the entire detection line extends on a surface of the base substrate along an extension direction parallel to the surface of the base substrate, all of the plurality of wire segments extend along the extension direction and are sequentially arranged along the extension direction, two adjacent wire segments of the plurality of wire segments are respectively a previous segment and a next segment, the previous segment has a first end close to the next segment in the extension direction, the next segment has a first end close to the previous segment in the extension direction, the first end of the previous segment overlaps and directly contacts the first end of the next segment;
wherein the plurality of wire segments comprise first wire segments and other wire segments beside the first wire segments, and a spacer is disposed between the first wire segments and the base substrate;
wherein the other wire segments comprise second wire segments, and
the first wire segments are alternately arranged with the second wire segments, and are overlapped on the second wire segments, respectively;
one of the first wire segments and one of the second wire segments that are adjacent to each other constitute the two adjacent wire segments of the plurality of wire segments; and
wherein a first target conductive layer, a first target insulating layer and a second target conductive layer, which are sequentially formed, are further disposed in the display area on the base substrate;
the second wire segments are arranged in a same layer as the first target conductive layer;
the first insulating layer is arranged in a same layer as the first target insulating layer; and
the first wire segments are arranged in a same layer as the second target conductive layer.

* * * * *